United States Patent
Ngo et al.

(10) Patent No.: US 6,436,808 B1
(45) Date of Patent: Aug. 20, 2002

(54) NH₃/N₂-PLASMA TREATMENT TO PREVENT ORGANIC ILD DEGRADATION

(75) Inventors: Minh Van Ngo, Fremont; Dawn Hopper, SAn Jose, both of CA (US); Jeremy Martin, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/731,007

(22) Filed: Dec. 7, 2000

(51) Int. Cl.⁷ .................... H01L 21/4763; H01L 21/31; H01L 21/464
(52) U.S. Cl. ........................................ 438/623; 438/780
(58) Field of Search ................. 438/780, 781, 438/623

(56) References Cited

U.S. PATENT DOCUMENTS

| | | |
|---|---|---|
| 4,756,977 A | 7/1988 | Haluska et al. |
| 5,866,945 A | 2/1999 | Chen et al. |
| 5,981,354 A | 11/1999 | Spikes et al. |
| 6,013,581 A * | 1/2000 | Wu et al. .................... 438/734 |
| 6,030,901 A | 2/2000 | Hopper et al. |
| 6,083,851 A | 7/2000 | Shields et al. |
| 6,251,771 B1 * | 6/2001 | Smith et al. ................. 438/626 |
| 6,284,657 B1 * | 9/2001 | Chooi et al. ................. 438/687 |

OTHER PUBLICATIONS

Chang et al. "A novel pretreatment technology for organic low–dielectric material to suppress copper diffusion and improve ashing resistance" Journal of the Electrochemical Society, 147(6), Jun. 2000, pp. 2332–2336.*

* cited by examiner

Primary Examiner—Olik Chaudhuri
Assistant Examiner—Erik Kielin

(57) ABSTRACT

Degradation of organic low-k interlayer dielectrics during fabrication is substantially prevented or significantly reduced by treatment with a plasma containing a source of hydrogen and $N_2$. Embodiments include treating a SiCOH, such as Black Diamond®, ILD with a $NH_3/N_2$ plasma after deposition, after forming a damascene opening therein and/or after CMP but prior to capping layer deposition.

30 Claims, 4 Drawing Sheets

$NH_3/N_2$-PLASMA TREATMENT TO PREVENT ORGANIC ILD DEGRADATION

RELATED APPLICATIONS

This application contains subject matter similar to subject matter disclosed in copending U.S. patent application Ser. No. 09/729,455 filed on Dec. 5, 2000.

TECHNICAL FIELD

The present invention relates to a method of manufacturing a semiconductor device exhibiting reduced capacitance loading. The present invention has particular applicability in manufacturing high density, multi-level semiconductor devices comprising sub-micron dimensions and exhibiting high circuit speed.

BACKGROUND ART

Interconnection technology is constantly challenged to satisfy the ever increasing requirements for high density and performance associated with ultra large scale integration semiconductor devices. The speed of semiconductor circuitry varies inversely with the resistance (R) and capacitance (C) of the interconnection system. The higher the value of the R×C product, the more limiting the circuit speed. As integrated circuits become complex and feature sizes and spacings become smaller, the integrated circuit speed becomes less dependent upon the transistor itself and more dependent upon the interconnection pattern. Thus, the performance of multi-level interconnects is dominated by interconnect capacitance at deep sub-micron regimes, e.g., less than about 0.12 micron. The rejection rate due to integrated circuits speed delays in sub-micron regimes has become a limiting factor in fabrication.

The dielectric constant of materials currently employed in the manufacture of semiconductor devices for an inter-layer dielectric (ILD) ranges from about 3.9 for dense silicon dioxide to over 8 for deposited silicon nitride. The value of the dielectric constant expressed herein is based upon a value of one for a vacuum. In an effort to reduce interconnect capacitance, dielectric materials with lower values of permitivity have been explored. The expression "low-k" material has evolved to characterize materials with a dielectric constant less than about 3.9. One type of low-k material that has been explored are a group of flowable oxides which are basically ceramic polymers, such as hydrogen silsesquioxane (HSQ). Such polymers and their use are disclosed in, for example, U.S. Pat. No. 4,756,977 and U.S. Pat. No. 5,981,354. HSQ-type flowable oxides have been considered for gap filling between metal lines because of their flowability and ability to fill small openings. HSQ-type flowable oxides have been found to be vulnerable to degradation during various fabrication steps, including plasma etching. Methods involving plasma treatment have been developed to address such problems attendant upon employing HSQ-type flowable oxides as a gap filling layer, as in the U.S. Pat. No. 5,866,945 and U.S. Pat. No. 6,083,851.

There are several organic low-k materials, typically having a dielectric constant of about 2.0 to about 3.8, which may offer promise for use as an ILD. As used throughout this disclosure, the term "organic" is intended to exclude HSQ type materials, e.g., flowable oxides and ceramic polymers, which are not true organic materials. Organic low-k materials which offer promise are carbon-containing dielectric materials such as FLARE 2.0™ dielectric, a poly(arylene) ether available from Allied Signal, Advanced Microelectronic Materials, Sunnyvale, Calif., Black-Diamond™ dielectric available from Applied Materials, Santa Clara, Calif., BCB (divinylsiloxane bisbenzocyclobutene) and Silk™ an organic polymer similar to BCB, both available from Dow Chemical Co., Midland, Mich.

In attempting to employ such carbon-containing low-k materials in interconnect technology, as for gap filling or as an ILD, it was found that their dielectric constant became undesirably elevated as a result of subsequent processing. For example, the dielectric constant of BCB was found to increase from about 2.6 to greater than about 4. It is believed that such an increase occurs as a result of exposure to an oxygen ($O_2$) plasma stripping technique employed to remove photoresist material after formation of an opening in a dielectric layer as, for example, a via hole or dual damascene opening for interconnecting of metal features on different metal levels. U.S. Pat. No. 6,030,901 discloses a method of addressing such a degradation problem by stripping a photoresist mask by using a $H_2N_2$ plasma.

There exists a need for methodology enabling the use of low-k carbon-containing dielectric materials as an ILD in high density, multi-level interconnection patterns. There exist a particular need for methodology enabling the use of such low-k materials while avoiding their degradation from various fabrication steps subsequent to deposition.

DISCLOSURE OF THE INVENTION

An advantage of the present invention is a method of manufacturing a semiconductor device exhibiting reduced parasitic RC time delays employing carbon-containing (i.e., organic) dielectric materials having a low dielectric constant.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming an organic layer having an exposed surface; and treating the exposed surface with a plasma containing a source of hydrogen, such as ammonia ($NH_3$), and nitrogen ($N_2$).

Embodiments of the present invention comprise depositing an ILD of an organic material, such as SiCOH containing Si-H bonds, and treating the surface with a $NH_3/N_2$ plasma. Subsequently, a damascene opening is formed in the ILD exposing internal surfaces and the exposed internal surfaces are also treated with the $NH_3/N_2$ plasma. After plasma treating the internal surfaces, the damascene opening is filled with a metal, and the overburden is planarized, as by chemical-mechanical polishing (CMP), leaving an exposed upper surface of the ILD. The exposed upper surface of the ILD is also treated with the $NH_3/N_2$ plasma before capping layer deposition. Plasma treatment of the organic ILD in accordance with the present invention at various times during the interconnect process substantially prevents or significantly reduces degradation of the organic ILD, such as an undesirable increase in the dielectric constant, undesirable shrinkage and an undesirable shifting in the reflective index, as a result of subsequent processing steps, such as $O_2$ ashing, etching, exposure to elevated temperature and/or exposure to various chemicals, e.g., CMP slurries.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded and illustrative in nature, and not as restrictive.

DESCRIPTION OF THE INVENTION

Figure 1:
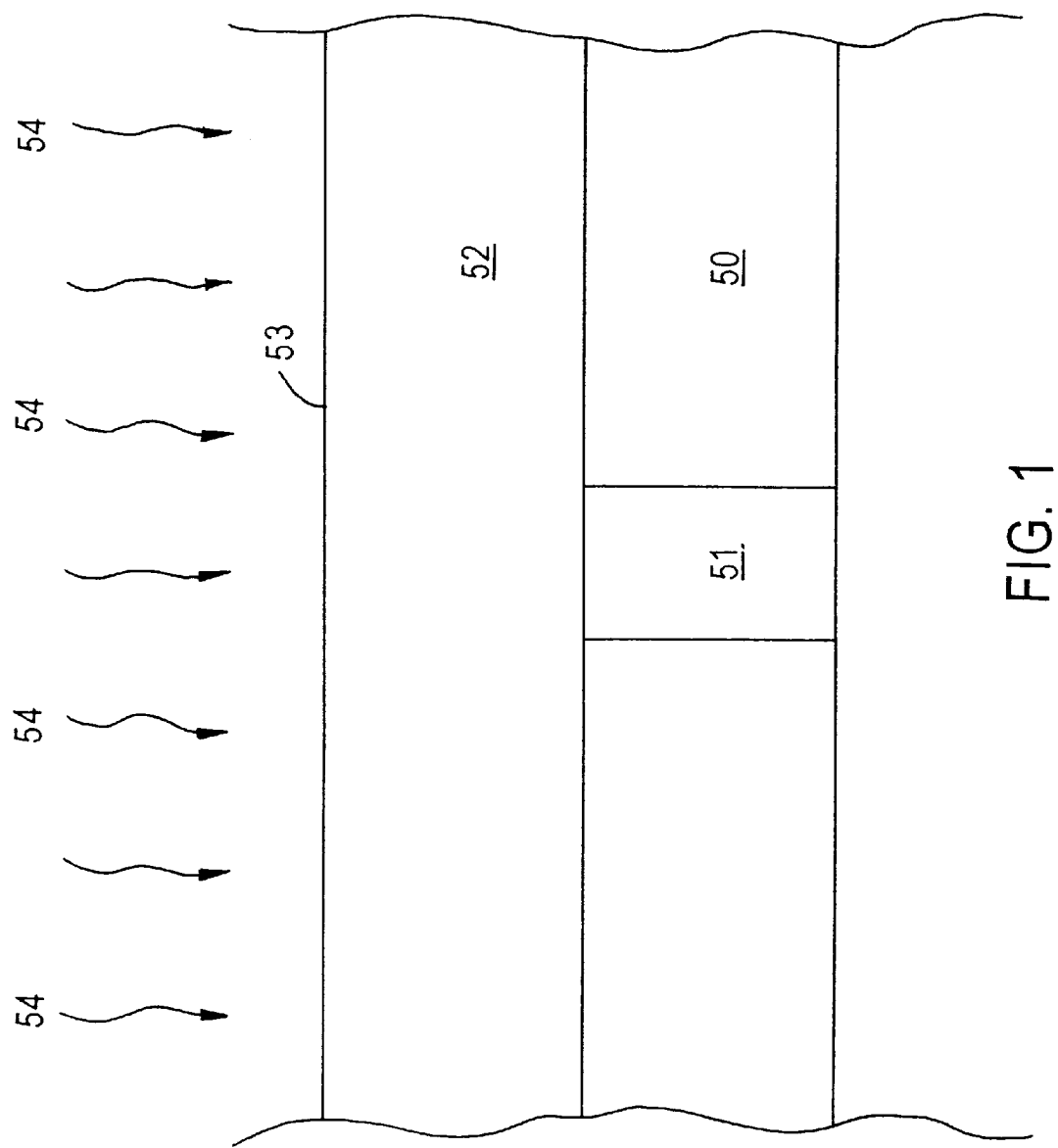
FIGS. 1–4 schematically illustrate sequential phases of a method in accordance with an embodiment of the present invention.

The present invention addresses and solves problems attendant upon conventional multi-layer interconnect devices, particularly parasitic RC time delays. The capacitance, both layer-to-layer and within-layer, is primarily attributed to the film properties of the ILD. The present invention enables the use of various low-k organic carbon-containing dielectric materials for ILDs without or with significantly reduced degradation of the dielectric materials.

Upon attempting to employ various organic carbon-containing materials, such as SiCOH, e.g., Black-Diamond™, it was found that degradation of important properties occurred at various times during fabrication. For example, upon experimentation and investigation, it was found that degradation manifested itself in various ways, such as by an increase in the dielectric constant, shrinkage of the deposited layer and a shift in the refractive index. It was found that Black-Diamond™ underwent an increase in the dielectric constant from about 3 to about 5, a shrinkage of about 20% and a significant change in the refractive index. Manifestly, such adverse degradation not only increases capacitance but adversely impacts device reliability.

The present invention addresses and solves such degradation problems attendant upon employing organic carbon-containing low-k materials for ILDs, i.e., increased dielectric constant, shrinkage and shift in refractive index, by treating exposed surfaces of the organic material with a plasma containing both a source of hydrogen, e.g., $NH_3$, and $N_2$, at various times during fabrication to substantially prevent or significantly reduce degradation which would otherwise occur by virtue of subsequent processing, such as etching, $O_2$ ashing, CMP, exposure to elevated temperatures and/or exposure to various chemicals.

The present invention is particularly applicable to interconnect technology involving damascene techniques. Thus, embodiments of the present invention comprise depositing an organic carbon-containing, low-k material, such as SiCOH, and treating the exposed upper surface with a plasma containing a source of hydrogen, such as $NH_3$, and $N_2$ ($NH_3/N_2$). Subsequently, openings are formed in the ILD by damascene techniques, including dual damascene techniques. The openings formed in the ILD can be via holes which are subsequently filled with a metal, such as copper (Cu) or a Cu alloy, to form a via interconnecting upper and lower metal lines, or a contact hole in which case the Cu or Cu alloy filled contact hole electrically connects a first metal layer with a source/drain region in the semiconductor substrate. The opening in the ILD can also be a trench, in which case the filled trench forms an interconnection line. The opening can also be formed by a dual damascene technique, in which a via/contact communicating with a line is simultaneously formed by metal deposition.

In accordance with embodiments of the present invention, the opening is treated with the $NH_3/N_2$ plasma prior to filling with a metal. Subsequent to metal deposition and CMP, the upper surface of the ILD is again treated with the plasma containing $NH_3/N_2$ prior to depositing the capping layer. Thus, embodiments of the present invention comprise treating exposed surfaces of a carbon-containing organic ILD at various phases from deposition to final encapsulation thereof with a $NH_3/N_2$ plasma, e.g., on at least three different occasions, to prevent degradation which would otherwise occur during subsequent processing. Such degradation can occur from plasma etching to form the damascene opening, $O_2$ ashing to remove the photoresist employed to form the opening, CMP or exposure to elevated temperature and/or various chemicals conventional as during cleaning of the opening, during CMP and during capping layer deposition.

A wide variety of organic carbon-containing low-k materials can be employed as an ILD in accordance with embodiments of the present invention, including various polyimides, BCB, FLARE™, Silk™, and Black-Diamond™ dielectrics. Other suitable low-k dielectrics include poly (arylene)ethers, poly(arylene)ether azoles; parylene-N, polyimides, polynapthalene-N, polyphenyl-quinoxalines (PPQ), polybenzoxazoles, polyindane, polynorbene, polystyrene, polyphenyleneoxide, polyethylene and polypropylene. It was found particularly suitable to employ SiCOH which exhibits a dielectric constant of about 3 and typically contains silicon in an amount of about 15 to about 18 at. %, e.g., about 17 at. %, oxygen in an amount of about 28 to about 30 at. %, e.g., about 29 at. %, carbon in an amount of about 16 to about 18 at. %, e.g., about 17 at. % and hydrogen in an amount of about 36 to about 38 at. %, e.g., about 37 at. %. SiCOH contains SiC, SiH, CH and SiOH bonding.

It was found that treatment of an organic carbon-containing low-k ILD in accordance with embodiments of the present invention employing a plasma comprising nitrogen and a source of hydrogen, e.g., a $NH_3/N_2$ plasma, substantially prevents or significantly reduces degradation, such that the dielectric constant, shrinkage and refractive index do not undergo a change in excess of 3%. It was also found that treatment of dielectric materials, such as SiCOH, with the $NH_3/N_2$ plasma substantially prevented a reduction in the number of Si-H bonds during subsequent processing.

Given the present disclosure and the objectives of the present invention, the conditions during $NH_3/N_2$ plasma treatment can be optimized in a particular situation. For example, it was found suitable to treat exposed surfaces of an organic carbon-containing low-k ILD, such as SiCOH, with the $NH_3/N_2$ plasma: a $N_2$ flow rate of about 3,000 to about 7,000 sccm; an $NH_3$ flow rate of about 50 to about 500 sccm; a pressure of about 3 to about 5 Torr; an RF power of about 250 to about 450 watts; a spacing (distance between the wafer and shower head from which gases exit) of about 500 to about 800 mils; and a temperature of about 380° C. to about 420° C., for about 15 to about 35 seconds.

Plasma treatment of a carbon-containing, organic low-k ILD in accordance with embodiments of the present invention can be performed on exposed surfaces prior to any subsequent processing which may degrade the properties of the ILD. Optimum results are achieved by treating all exposed surfaces of the carbon-containing organic ILD with the plasma containing nitrogen and a source of hydrogen, e.g., a $NH_3/N_2$ plasma, prior to any subsequent processing which would otherwise result in degradation of the ILD properties, e.g., increase the dielectric constant, shrinkage and/or shift in the refractive index.

Experimentation was conducted on SiCOH to demonstrate the effectiveness of $NH_3/N_2$ plasma treatment in accordance with embodiments of the present invention. The controls comprise an SiCOH film on which $O_2$ ashing was not conducted and a SiCOH film on which $O_2$ ashing was conducted. Plasma treatments included $NH_3/N_2$ as well as $H_2/N_2$, $NH_3$ and $H_2$. The results consistently showed that plasma treatment in accordance with embodiments of the present invention substantially prevented or significantly reduced degradation in the SiCOH structure, an increase in the dielectric constant and a change in the thickness of the SiCOH film.

A method in accordance with an embodiments of the present invention is schematically illustrated in FIGS. 1 through 4, wherein like features are denoted by like reference numerals. Adverting to FIG. 1, reference numeral 51 denotes a lower metal feature formed in ILD 50 overlying a substrate or wafer (not shown). ILD 50 can comprise any conventional dielectric material or an organic carbon-containing low-k material previously treated in accordance with the present invention with a plasma containing nitrogen and a source of hydrogen, e.g., a $NH_3/N_2$ plasma. An organic carbon-containing low-k ILD 52, such as SiCOH, is deposited over ILD 50 and metal feature 51. In accordance with an embodiment of the present invention, the upper exposed surface 53 of SiCOH ILD 52 is treated with a $NH_3/N_2$ plasma 54 to substantially prevent or significantly reduce degradation during subsequent processing. Such subsequent processing would include forming a photomask, etching to form an opening, removing the photoresist and cleaning the opening, which would otherwise degrade SiCOH ILD 52.

Figure 2:
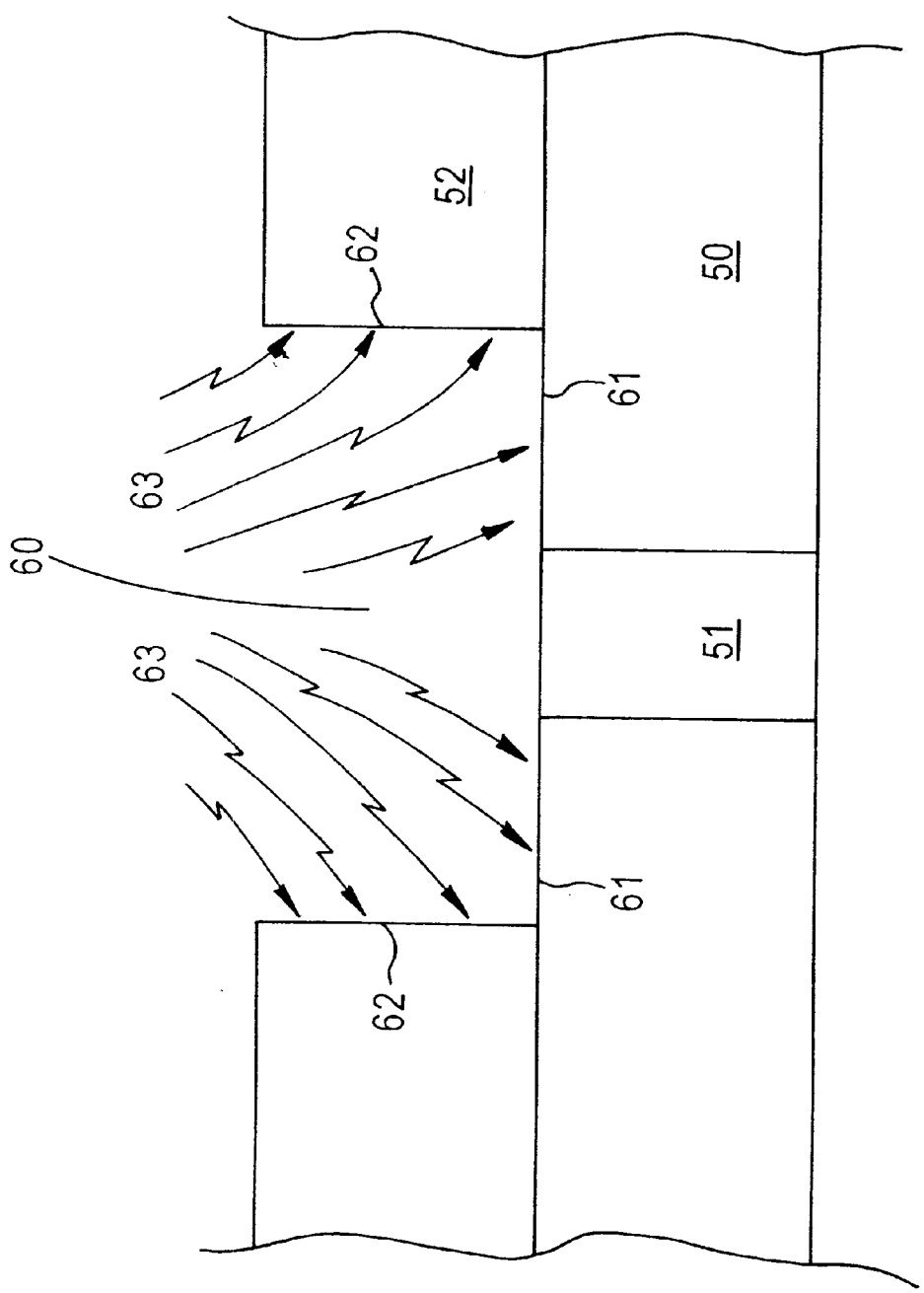

Adverting to FIG. 2, opening 60, e.g, a trench, is formed by a conventional damascene technique leaving exposed side surfaces of SiCOH layer 52 as well as exposed upper surfaces of ILD 50. In accordance with embodiments of the present invention, such exposed surfaces are treated with the $NH_3/N_2$ plasma to substantially prevent or significantly reduce degradation of SiCOH layer 52 and ILD 50, particularly if ILD 50 is also a carbon-containing low-k material. Such plasma treatment is performed prior to photoresist stripping and solvent cleaning which would otherwise degrade the SiCOH ILD 52 (and ILD 50 particularly if it is made of a organic carbon-containing low-k material).

Figure 3:
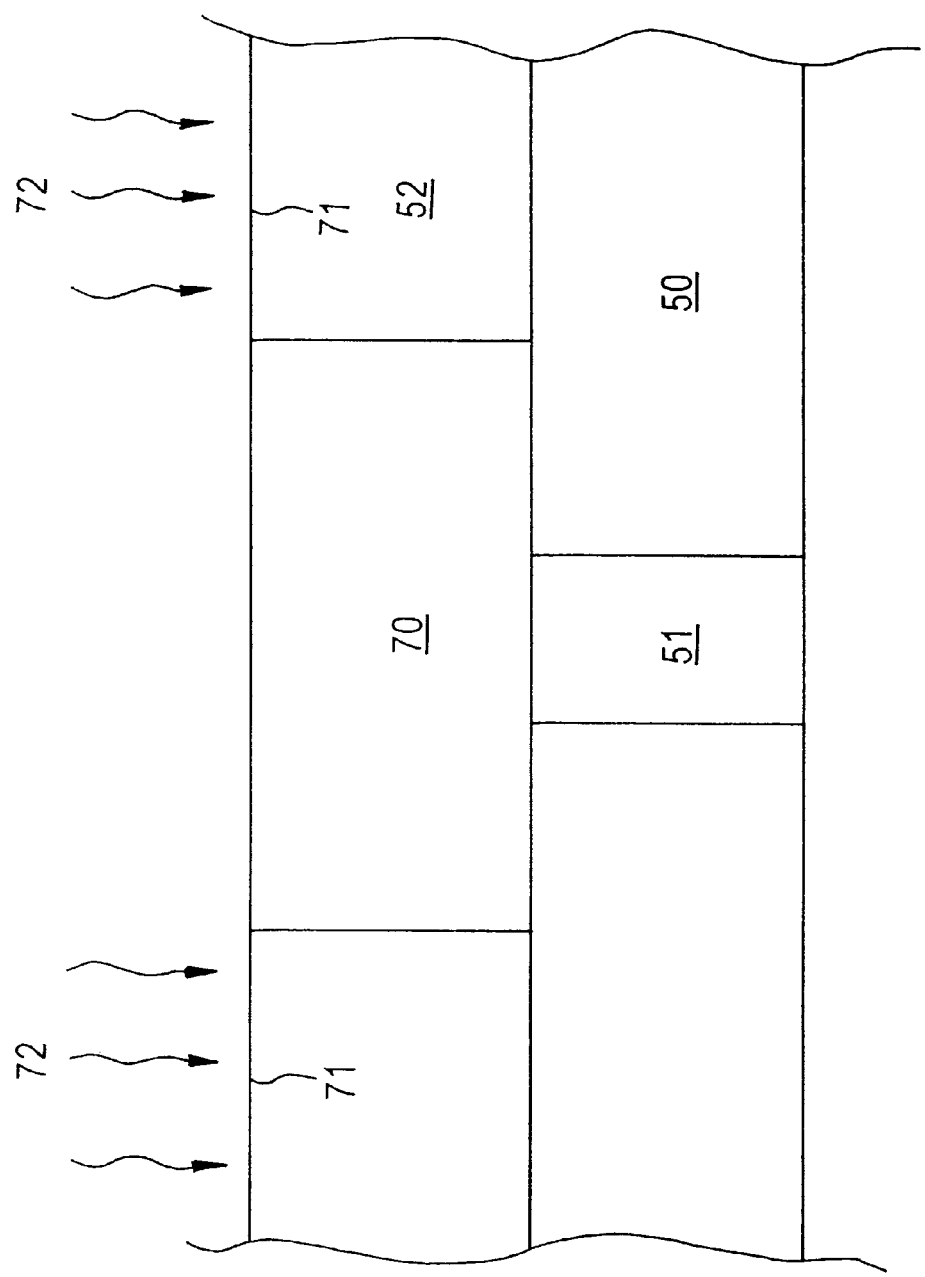

Subsequently, as shown in FIG. 3, a metal is deposited into trench 60 to form a conductive line 70, such as Cu or a Cu alloy. In implementing Cu interconnect technology, a barrier layer and seed layer are typically deposited in accordance with conventional practices. Subsequent to metal deposition, CMP is conducted to form a planarized surface exposing the upper surface 71 of SiCOH layer 52. Such CMP exposes ILD 52 to chemicals that would have caused degradation but for prior plasma treatement.

Figure 4:
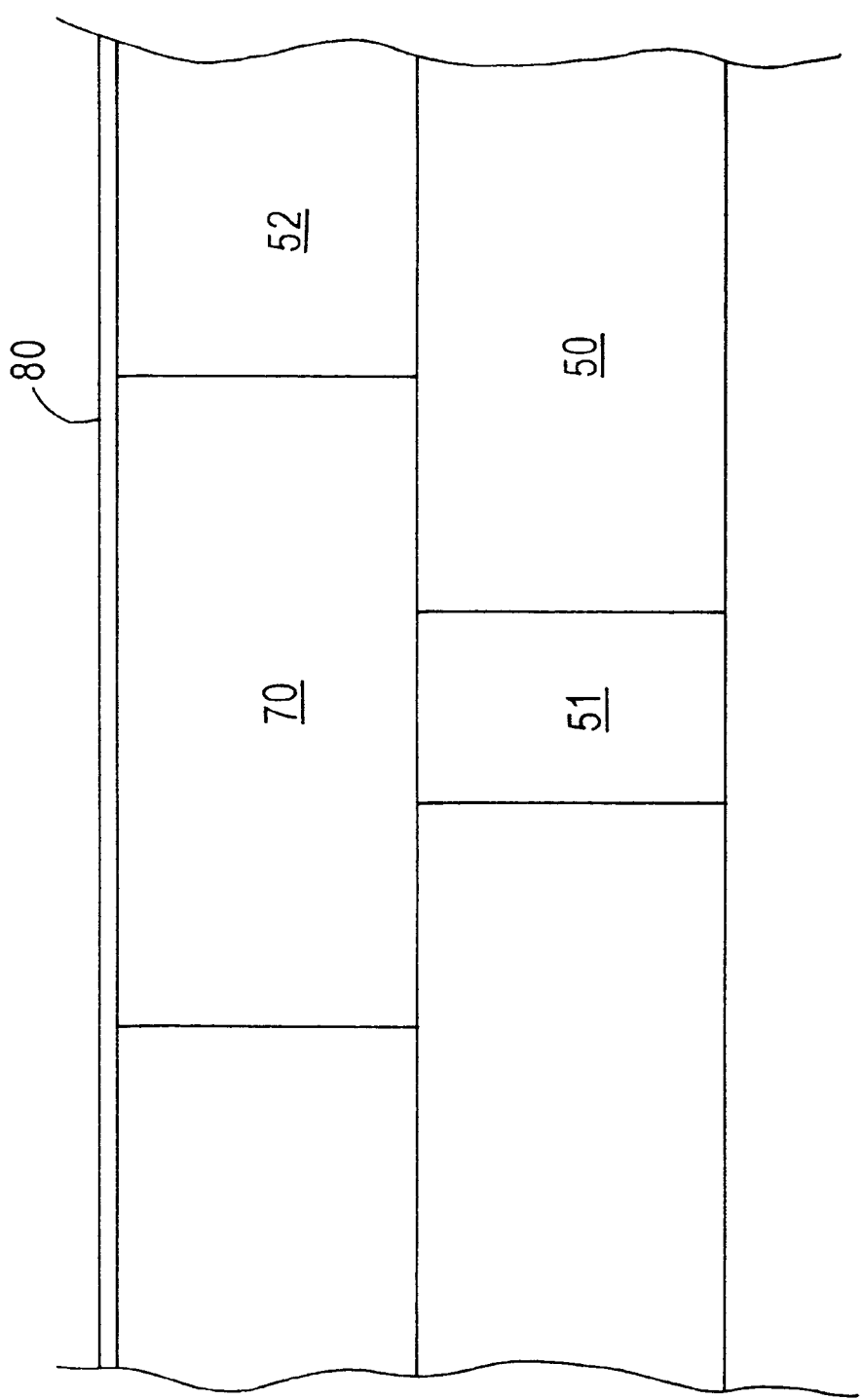

At this point, prior to subsequent processing, the exposed upper surface 71 of SiCOH layer 52 is treated with the $NH_3/N_2$ plasma to prevent degradation which would otherwise occur during subsequent processing, including deposition of a capping layer and exposure to elevated temperatures. As shown in FIG. 4, capping layer 80, such as silicon nitride, is then deposited to encapsulate metal 70 as well as SiCOH layer 52.

It should be apparent from FIGS. 1 through 4 that embodiments of the present invention include treating exposed surfaces of an organic carbon-containing low-k material, such as SiCOH, with an $NH_3/N_2$ plasma prior to processing and/or exposure to chemicals which would otherwise significantly degrade the characteristics of the ILD, such as increasing its dielectric constant, reducing its thickness and shifting its refractive index. Plasma treatment in accordance with the embodiments of the present invention using a combination of a source of hydrogen, e.g., $NH_3$, and $N_2$, effectively prevents such degradation, thereby enabling the use of organic low-k dielectric material as ILDs with an attendant reduction in the RC constant, cross-talk voltage and power dissipation between lines.

The exact mechanism involved in protecting the organic low-k material from degradtion in accordance with embodiments of the present invention is not known with certainty. However, it is believed that plasma treatment in accordance with the present invention results in the formation of a strongly bonded thin skin on the surface of the organic low-k material, such as a thin skin of silicon oxynitride or SiN, as at a thickness of about 20Å to about 50Å, which prevents degradation of the organic low-k material, particularly preventing an increase in its dielectric constant.

The present invention enjoys industrial applicability in manufacturing highly integrated semiconductor devices exhibiting increased circuit speed and sub-micron dimensions, e.g., with a design rule of about 0.12 micron and under. The present invention includes the use of various metals for the interconnection system, particularly Cu and Cu alloys, employing both single and dual damascene techniques.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising:

forming an organic interlayer dielectric (ILD) having an exposed surface;

forming a damascene opening in the ILD;

filling the damascene opening with a metal;

planarizing leaving an upper surface of the ILD exposed; and treating the exposed surface of the ILD with a plasma containing a source of hydrogen and nitrogen ($N_2$) to substantially prevent or substantially reduce degradation thereof that would otherwise occur during subsequent processing.

2. The method according to claim 1, comprising treating the exposed surface of the ILD with a plasma containing ammonia ($NH_3$) and $N_2$.

3. The method according to claim 1, comprising filling the damascene opening with copper (Cu) or a Cu alloy.

4. The method according to claim 2, comprising treating the exposed surface of the ILD with the plasma to substantially prevent or substantially reduce an increase in the dielectric constant, shrinkage and/or a shift in the refractive index of the ILD during subsequent processing.

5. (Amended) The method according to claim 2 wherein the ILD contains carbon, silicon, oxygen and hydrogen.

6. The method according to claim 5 wherein the ILD is SiCOH and contains Si-H bonds.

7. The method according to claim 6 comprising treating the exposed surface of the ILD with the plasma to substantially prevent or substantially reduce a reduction in the number of Si-H bonds during subsequent processing.

8. The method according to claim. 2, comprising treating the exposed surface of the ILD with the plasma at:
a $N_2$ flow rate of about 3,000 to about 7,000 sccm;
an $NH_3$ flow rate of about 50 to about 500 sccm;
a pressure of about 3 to about 5 Torr;
an RF power of about 250 to about 450 watts;
a spacing of about 500 to about 800 mils; and
a temperature of about 380° C. to about 420° C., for about 15 to about 35 seconds.

9. The method according to claim 2, comprising treating the as-deposited ILD with the plasma before subsequent processing.

10. The method according to claim 9, comprising:
forming the damascene opening in the ILD, after plasma treating the as-deposited organic ILD, exposing internal surfaces of the ILD within the opening; and
treating the exposed internal surfaces of the ILD with the plasma.

11. The method according to claim 10, comprising:
filling the damascene opening with the metal after plasma treating the exposed internal surfaces of the ILD; and
planarizing by chemical mechanical.

12. The method according to claim 1, comprising depositing a capping layer after treating the exposed upper surface of the ILD with the plasma.

13. The method according to ILD claim 4, comprising plasma treating the exposed surface of the ILD to prevent the dielectric constant of the ILD from increasing more than 3%.

14. The method according to claim 4, comprising plasma treating the exposed surface of the ILD to prevent the ILD from shrinking more than about 3%.

15. A method of manufacturing a semiconductor device, the method comprising:
forming an organic layer having an exposed surface, wherein the organic layer is SiCOH and contains Si-H bonds; and
treating the exposed surface with a plasma containing a source of hydrogen and nitrogen ($N_2$).

16. The method according to claim 15, comprising treating the exposed surface with a plasma containing ammonia ($NH_3$) and $N_2$.

17. The method according to claim 16, comprising treating the organic layer with the plasma to substantially prevent or substantially reduce degradation thereof that would otherwise occur during subsequent processing.

18. The method according to claim 16, comprising:
depositing the organic layer as an interlayer dielectric (ILD);
forming a damascene opening in the ILD exposing internal surfaces of the ILD within the opening; and
treating the exposed internal surfaces of the ILD with the plasma.

19. The method according to claim 16, comprising:
depositing the organic layer as an interlayer dielectric (ILD);
forming a damascene opening in the ILD;
filling the damascene opening with a metal;
planarizing by chemical mechanical polishing leaving an outer surface of the ILD exposed; and
treating the exposed outer surface of the ILD with the plasma.

20. The method according to claim 17, comprising treating the exposed surface with the plasma to substantially prevent or substantially reduce an increase in the dielectric constant, shrinkage and/or a shift in the refractive index of the dielectric layer during subsequent processing.

21. The method according to claim 15 comprising treating the exposed surface with the plasma to substantially prevent or substantially reduce a reduction in the number of Si-H bonds during subsequent processing.

22. The method according to claim 16, comprising treating the exposed surface with the plasma at:
a $N_2$ flow rate of about 3,000 to about 7,000 sccm;
an $NH_3$ flow rate of about 50 to about 500 sccm;
a pressure of about 3 to about 5 Torr;
an RF power of about 250 to about 450 watts;
a spacing of about 500 to about 800 mils; and
a temperature of about 380° C. to about 420° C., for about 15 to about 35 seconds.

23. The method according to claim 16, comprising:
depositing the organic layer as an interlayer dielectric (ILD); and
treating the as-deposited ILD with the plasma before subsequent processing.

24. The method according to claim 23, comprising:
forming a damascene opening in the ILD, after treating the as-deposited ILD, exposing internal surfaces of the organic ILD within the opening; and
treating the exposed internal surfaces of the ILD with the plasma.

25. The method according to claim 24, comprising:
filling the damascene opening with a metal after plasma treating the exposed internal surfaces of the ILD;
planarizing by chemical mechanical polishing leaving an upper surface of the ILD exposed; and
treating the exposed upper surface of the ILD with the plasma.

26. The method according to claim 20, comprising plasma treating to prevent the dielectric constant of the organic layer from increasing more than 3%.

27. The method according to claim 20, comprising plasma treating to prevent the organic layer from shrinking more than about 3%.

28. The method according to claim 25, comprising depositing a capping layer after treating the exposed outer surface of the ILD with the plasma.

29. The method according to claim 25, comprising filling damascene opening with copper (Cu) or a Cu Alloy.

30. The method according to claim 19, comprising filling the damascene opening with copper (Cu) or a Cu alloy.

* * * * *